United States Patent [19]

Mizuta

[11] Patent Number: 4,916,662
[45] Date of Patent: Apr. 10, 1990

[54] IC CARD INCLUDING HIGH INPUT VOLTAGE DETECTION AND SUPPRESSION

[75] Inventor: Masaharu Mizuta, Itami, Japan

[73] Assignee: Mitsubishi Denki Kabushiki Kaisha, Japan

[21] Appl. No.: 241,213

[22] Filed: Sep. 7, 1988

[30] Foreign Application Priority Data

Sep. 18, 1987 [JP] Japan ................................. 62-235884

[51] Int. Cl.⁴ .......................... G11C 5/00; G11C 7/00; G06K 5/00; G06K 19/06
[52] U.S. Cl. ...................................... 365/52; 365/226; 365/228; 365/189.06; 235/380; 235/492
[58] Field of Search ............ 365/52, 226, 228, 189.01, 365/189.06; 235/436, 441, 492, 380

[56] References Cited

U.S. PATENT DOCUMENTS

| | | | |
|---|---|---|---|
| 4,727,244 | 2/1988 | Nakano et al. | 235/492 |
| 4,767,920 | 8/1988 | Kitta et al. | 235/492 |
| 4,785,166 | 11/1988 | Kushima | 235/492 |

Primary Examiner—Glenn A. Gossage
Attorney, Agent, or Firm—Leydig, Voit & Mayer

[57] ABSTRACT

An IC card writing system for writing data in a memory in an IC card includes a data writing device for writing data in the memory in the IC card utilizing a voltage which is below a predetermined value after it has received a memory identification signal, by applying a voltage having at least the predetermined value to an input terminal of the IC card. A high voltage detecting/suppressing circuit detects the voltage applied to the input terminal of the IC card by the data writing device, and, when the voltage equals or exceeds the predetermined value, suppresses the voltage applied to the input terminal of the IC card to below the predetermined value while outputting a detection signal. A memory identification signal generating circuit containing memory identification data concerning the memory of the IC card outputs the memory identification signal to the data writing device when it receives the detection signal from the high voltage detecting/suppressing circuit.

4 Claims, 3 Drawing Sheets

IC CARD INCLUDING HIGH INPUT VOLTAGE DETECTION AND SUPPRESSION

BACKGROUND OF THE INVENTION

1. Field of the Invention

The present invention relates to an IC card writing system for writing data in an IC card incorporating a memory.

2. Description of the Related Art

Memories for incorporation in IC cards and of the type which output a memory identification signal to inform a user of the name of the manufacturer of the memory or the type thereof are known. Such memory identification signals enable a writing device to set program conditions suited to the memory. In general, a memory identification signal is output from a memory by the application of a predetermined high voltage to an input line of the memory.

FIG. 1 schematically shows a known IC card writing system. In FIG. 1, an IC card A incorporates a memory 1 for storing data. A writing device B is connected to an input terminal 3 and an output terminal 4 of the IC card A.

The thus-arranged IC card writing system will be operated in the manner described below. After the system has been turned on, the writing device B applies a high voltage which may be about 12 V to the input terminal 3 of the IC card 1, so as to obtain a memory identification signal as a result of the high voltage being applied to the memory 1. The voltage is, for example, applied to a ninth address line $A_9$ in case of using a M5M27C256-type IC for the memory 1. The memory 1, to which a high voltage and the other required voltages have been applied, outputs an identification signal, for example, 8-bits in length, from the output terminal 4 of the IC card A to writing device B through a data bus. The writing device B, where the identification signal is detected, then begins to write data in the memory 1 in a suitable form.

The IC card A illustrated in FIG. 1, however, is only theoretical and, in general, practical IC cards incorporate a peripheral IC 2 or a widely used IC gate such as a buffer circuit connected between the memory 1 and the input terminal 3 as shown in FIG. 2, so as to prevent noise due to static electricity. For example, a 74HC245-type can be used as the peripheral IC 2.

In FIG. 2, the IC card A has resistance to static electricity by virtue of the peripheral IC 2. This IC card A incorporating the memory 1 and the peripheral IC 2 can withstand several thousand volts of static electricity while an IC card incorporating only the memory 1 can withstand only several hundred volts of static electricity. In addition, in a case where a plurality of memories 1 are incorporated in one IC card A and a plurality of connection signals are input to and output from the memories in parallel, peripheral IC 2 prevents a delay waveform from being generated between the connection signals. In this manner, the peripheral IC 2 is a necessity for an IC card having a large capacity.

Suitable elements that may be utilized in an IC card A as the memory 1 include a PROM (a programmable read only memory). Suitable PROMs in turn include an EPROM (an erasable programmable read only memory) into which data can be electrically written and from which data can be erased by ultraviolet radiation, and an EEPROM (an electrically erasable programmable read only memory) from which data can be electrically erased. There has recently been an increasing demand for reductions in the level of power consumption of IC cards, and lower voltages have been adopted accordingly for writing data in EPROMs.

However, in a case where the peripheral IC 2 is incorporated in the IC card A between the input terminal 3 and the memory 1 for generating an identification signal by the receipt of a high voltage as shown in FIG. 2, the high voltage is applied by the writing device B to the memory 1 through the peripheral IC 2. Generally, the voltage applied by the writing device B to obtain an identification signal is about 12 V. Combined with the fact that the maximum rated voltage for an IC is in general about 7 V, this is rather high, and may lead to some risk of the peripheral IC 2 being damaged.

SUMMARY OF THE INVENTION

In view of the above-described problem of the conventional art, an object of the present invention is to provide an IC card writing system which enables identification data to be input to a writing device without application of a high voltage to an IC card, and which enables writing to be performed without damaging a peripheral IC.

To this end, the present invention provides an IC card writing system for writing data in a memory in an IC card, which comprises:

a data writing device for writing data in the memory of the IC card utilizing a voltage which is below a predetermined value, after it has received a memory identification signal concerning the memory, by applying a voltage of at least the predetermined value to an input terminal of the IC card;

a high voltage detecting/suppressing circuit for detecting the voltage applied to the input terminal of the IC card by the data writing device, and for, when the voltage equals or exceeds the predetermined value, suppressing the voltage applied to the input terminal of the IC card to below the predetermined value while outputting a detection signal; and a memory identification signal generating circuit for containing memory identification data concerning the memory of the IC card, and for outputting the memory identification signal to the data writing device on the basis of the memory identification data when it receives the detection signal from the high voltage detecting/suppressing circuit.

DESCRIPTION OF THE PREFERRED EMBODIMENT

Referring now to the accompanying drawings, a description will be given of a preferred embodiment of the present invention.

Figure 1:
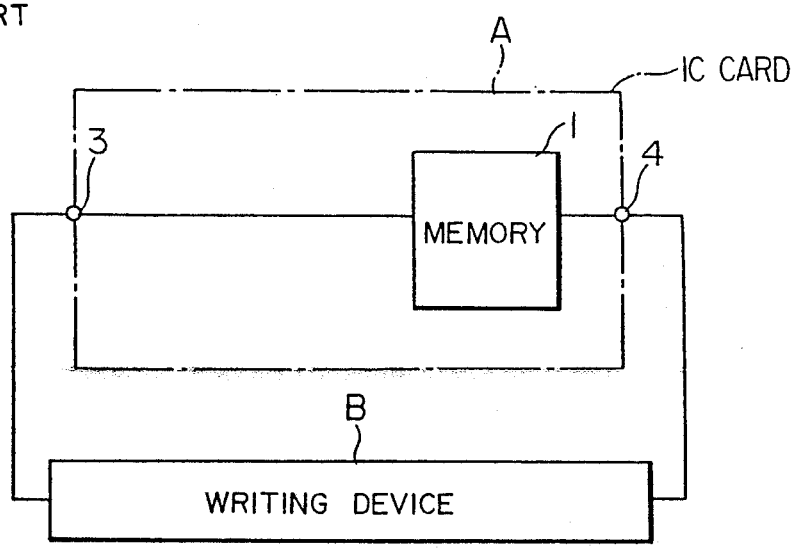
FIGS. 1 and 2 are block diagrams of known IC card writing systems.
Figure 2:
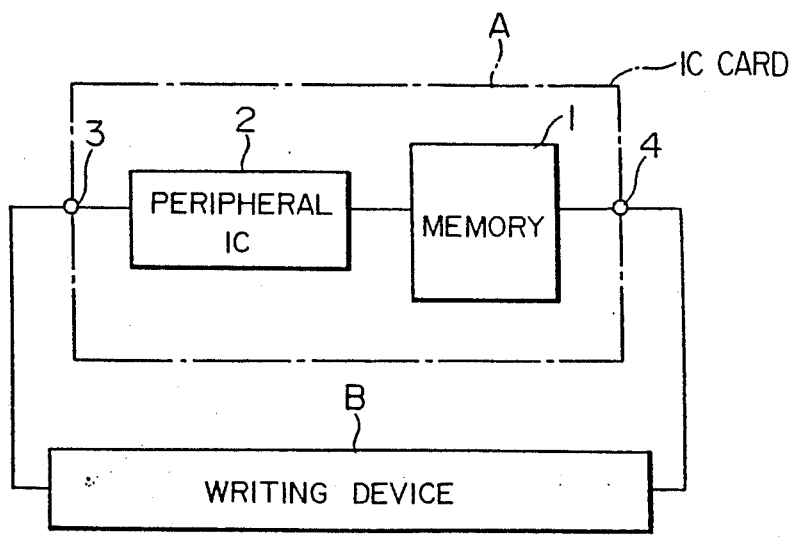
Figure 3:
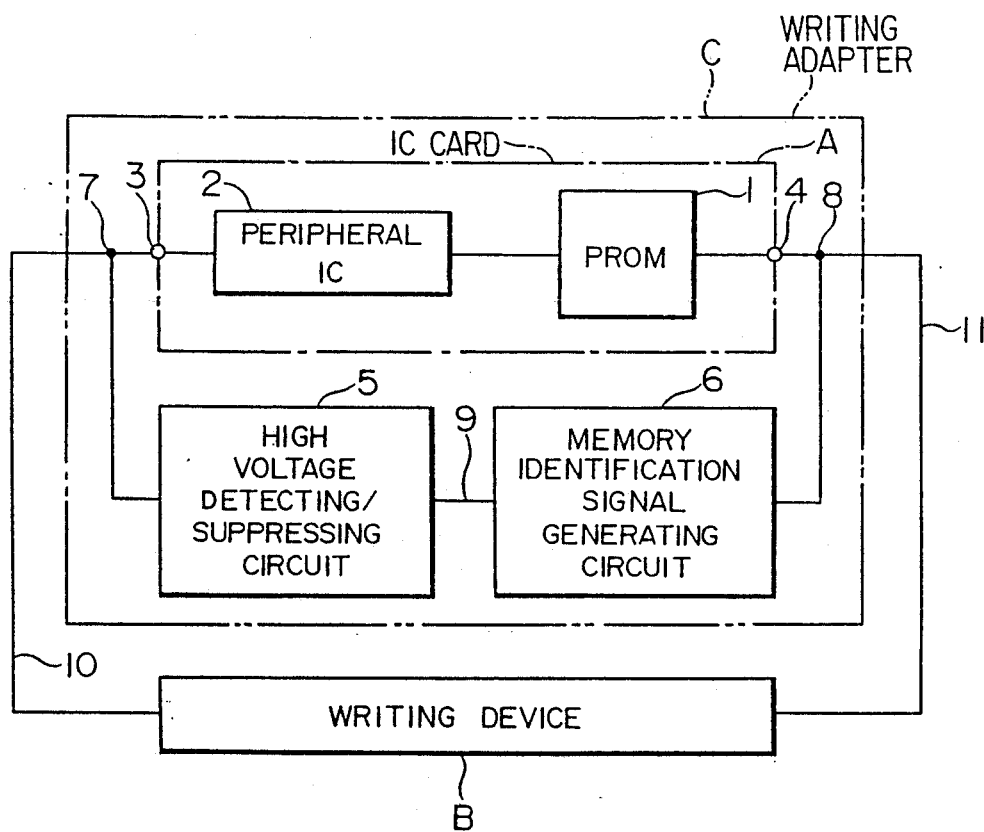
FIG. 3 is a block diagram of an IC card writing system, shown an embodiment of the present invention.

In FIG. 3, an IC card A is inserted in a writing adapter C, which is connected to a writing device B. The IC card A incorporates a PROM 1 which serves as a memory, and a peripheral IC 2. The writing adapter C has an input terminal 7, an output terminal 8, a high voltage detecting/suppressing circuit 5, and a memory identification signal generating circuit 6, the high voltage detecting/suppressing circuit 5 and the memory identification signal generating circuit 6 being connected in series between the input terminal 7 and the output terminal 8. When the IC card A is inserted into the writing adapter C, an input terminal 3 and an output terminal 4 of the IC card A are respectively connected to the input terminal 7 and the output terminal 8 of the writing adapter C. The high voltage detecting/suppressing circuit 5 and the memory identification signal generating circuit 6 are connected to each other through a signal line 9.

The high voltage detecting/suppressing circuit 5 detects a voltage applied to the input terminal 7 of the writing adapter C and, when the voltage equals or exceeds a predetermined value, outputs a detection signal to the signal line 9 while suppressing the potential at the input terminal 7 to a value which may be 7 V or below. The identification signal generating circuit 6 contains data which represents the type of the PROM 1 incorporated in the IC card A and the name of the manufacturer of the IC card A, and, when the detection signal is input from the high voltage detecting/suppressing circuit 5 through the signal line 9, outputs a memory identification signal which represents the above-described data to the output terminal 8.

The writing device B is connected to the input terminal 7 and the output terminal 8 of the writing adapter C through an output signal line 10 and an input signal line 11, respectively.

The thus-arranged IC card writing system will be operated in the manner described below.

First, the IC card A is inserted into the writing adapter C so that the input terminal 3 and the output terminal 4 of the IC card A are connected to the input terminal 7 and the output terminal 8 of the writing adapter C, respectively.

When data is to be written in the PROM 1 in the IC card A, a high voltage which may be about 12 V is applied to the input terminal 7 of the writing adapter C from the writing device B through the output signal line 10. At this time, the high voltage detecting/suppressing circuit 5 detects the application of the high voltage to the input terminal 7, and suppresses the potential at the input terminal 7 to 7 V or below while outputting to the memory identification signal generating circuit 6 a detection signal which identifies the fact that the high voltage has been applied.

Next, a memory identification signal is output to the output terminal 8 of the writing adapter C from the memory identification signal generating circuit 6 to which the detection signal has been input through the signal line 9, and the memory identification signal is then input to the writing device B through the input signal line 11. Upon receipt of the memory identification signal, the writing device B determines program conditions which are suited to the PROM 1 of the IC card A on the basis of the data in the memory identification signal. By this time, application of the high voltage from the writing device B to the writing adapter C has been stopped and hence the control of the potential at the input terminal 7 by the high voltage detecting/suppressing circuit 5 has also stopped.

Thereafter, a writing instruction and data are sent from the writing device B to the IC card A through the output signal line 10 and the input terminal 7 of the writing adapter C on the basis of the determined program conditions, thereby writing data in the PROM 1.

Thus, in the above-described writing system, the memory identification signal can be generated without application of a high voltage to the IC card A whereby damage to the peripheral IC 2 can be prevented.

Figure 4:
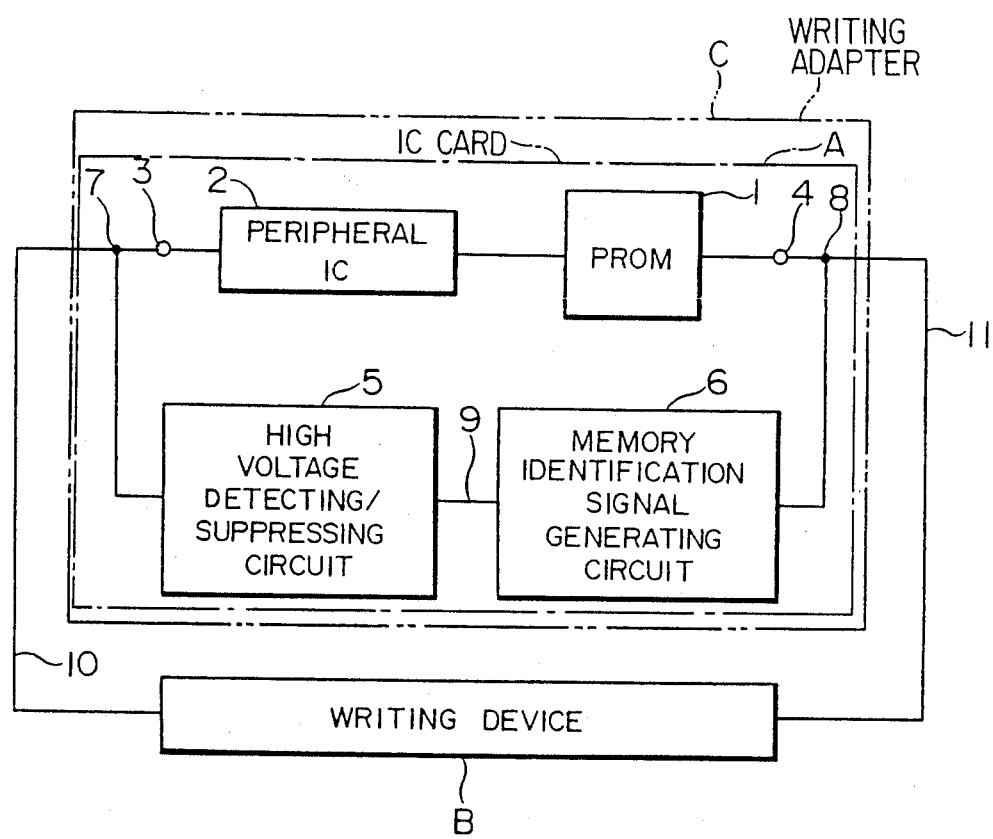
FIG. 4 is a block diagram of an IC card writing system showing a second embodiment of the present invention.

In the above-described embodiment, the high voltage detecting/suppressing circuit 5 and the memory identification signal generating circuit 6 are connected between the writing device B and the IC card A. However, these circuits may also be incorporated within the IC card A as schematically shown in FIG. 4. In this case, damage to the peripheral IC 2 can also be prevented, as in the case of the above-described embodiment.

What is claimed is:

1. An IC card writing system for writing data in a memory in an IC card comprising:

a data writing device for writing data in a memory of an IC card utilizing a voltage which is below a predetermined value, after receiving a memory identification signal concerning said memory, by applying an input voltage having at least the predetermined value to an input terminal of said IC card;

a high voltage detecting/suppressing means for detecting the input voltage applied to said input terminal of said IC card by said data writing device, and for, when the input voltage equals or exceeds the predetermined value, suppressing the input voltage applied to said input terminal of said IC card to below the predetermined value while outputting a detecting signal; and a memory identification signal generating means for containing memory identification data concerning said memory of said IC card and for outputting said memory identification signal to said data writing device on the basis of said memory identification data when the detection signal is output from said high voltage detecting/suppressing means.

2. An IC card writing system according to claim 1 comprising a writing adapter incorporating said high voltage detecting/suppressing means and said memory identification signal generating means into which said IC card is detachably inserted.

3. An IC card writing system according to claim 1 wherein said high voltage detecting/suppressing means and said memory identification signal generating means are both incorporated within said IC card.

4. An IC card writing system according to claim 1 wherein said memory comprises a programmable read only memory.

* * * * *